(12) United States Patent
Xu et al.

(10) Patent No.: US 11,309,359 B2
(45) Date of Patent: Apr. 19, 2022

(54) DISPLAY PANEL COMPRISING DISPLAY LAYER

(71) Applicant: WUHAN CHINA STAR OPTOELECTRONICS SEMICONDUCTOR DISPLAY TECHNOLOGY CO., LTD., Wuhan (CN)

(72) Inventors: Bin Xu, Wuhan (CN); Hongyu Xu, Wuhan (CN)

(*) Notice: Subject to any disclaimer, the term of this patent is extended or adjusted under 35 U.S.C. 154(b) by 613 days.

(21) Appl. No.: 16/326,486

(22) PCT Filed: Nov. 23, 2018

(86) PCT No.: PCT/CN2018/117277
§ 371 (c)(1),
(2) Date: Feb. 19, 2019

(87) PCT Pub. No.: WO2020/082488
PCT Pub. Date: Apr. 30, 2020

(65) Prior Publication Data
US 2021/0384260 A1   Dec. 9, 2021

(30) Foreign Application Priority Data
Oct. 23, 2018   (CN) .......................... 201811239386.6

(51) Int. Cl.
*H01L 27/32*   (2006.01)

(52) U.S. Cl.
CPC ........ *H01L 27/322* (2013.01); *H01L 27/3246* (2013.01)

(58) Field of Classification Search
USPC .......................................................... 257/40
See application file for complete search history.

(56) References Cited

U.S. PATENT DOCUMENTS

| 2012/0235175 A1 | 9/2012 | Prushinskiy et al. |
| 2013/0112955 A1* | 5/2013 | Yamazaki ............. H01L 51/525 257/40 |

(Continued)

FOREIGN PATENT DOCUMENTS

| CN | 104347680 A | 2/2015 |
| CN | 104681592 A | 6/2015 |
| CN | 108089368 A | 5/2018 |

*Primary Examiner* — Nduka E Ojeh
(74) *Attorney, Agent, or Firm* — JMB Davis Ben-David

(57) ABSTRACT

A display panel includes an array substrate and a display layer disposed on the array substrate. The display layer includes a plurality of display units. Each of the display units includes: a first electrode disposed on the array substrate; an organic material functional layer including a light-emitting area and a light-transparent area connected to and surrounding the light-emitting area, wherein the light-emitting area is disposed on the first electrode; a second electrode disposed on the organic material functional layer; a pixel defining layer disposed under a bottom surface of the organic material functional layer and extending from the light-emitting area to the light-transparent area, wherein there is a light-transparent void between the pixel defining layer and the array substrate; and a color resist filling the light-transparent void. Two adjacent color resists of any two adjacent display units have an overlapping region therebetween.

9 Claims, 2 Drawing Sheets

(56) References Cited

U.S. PATENT DOCUMENTS

| | | | |
|---|---|---|---|
| 2015/0236295 A1 | 8/2015 | Lim et al. | |
| 2016/0181343 A1 | 6/2016 | Wang et al. | |
| 2016/0293670 A1* | 10/2016 | Chen | H01L 51/5088 |
| 2017/0154930 A1* | 6/2017 | Kim | G02B 5/201 |
| 2019/0219868 A1 | 7/2019 | Hui et al. | |
| 2019/0348480 A1* | 11/2019 | Wu | H01L 27/3246 |

* cited by examiner

DISPLAY PANEL COMPRISING DISPLAY LAYER

CROSS-REFERENCE TO RELATED APPLICATIONS

This is the U.S. National Stage of International Patent Application No. PCT/CN2018/117277, filed Nov. 23, 2018, which in turn claims the benefit of Chinese Patent Application No. 201811239386.6, filed Oct. 23, 2018.

FIELD OF INVENTION

The present disclosure relates to the field of display technology, and more particularly to a display panel.

BACKGROUND

With increase of demand in thin displays, development of self-illumination displays is getting more and more important in recent years. One of self-illumination display is an organic light emitting diode (OLED) display, which have outstanding properties, including being self-illuminating, low power consumption, wide viewing angles, wide color gamut, short response times, and flexibility. Thus, OLED displays attract research groups and manufacturers' attentions, and are considered as a new succeeding display technology.

At present, pixel defining layer formed in OLED displays is generally made of light-transparent material. External environmental light, after passing through pixel defining layer, enters array substrate and is reflected from array substrate. This decreases contrast of displayed images.

If contrast can be remarkably increased, displayed colors and images would be more satisfactory. One way to increase contrast is to increase brightness of display units. The other way to increase contrast is to avoid external environmental light entering display panels from being reflected back. Because external environmental light enters display panels from outside and then is reflected back by metal wiring (such as metal electrodes) included in display panels toward outside, viewers, when viewing displayed images in front of display panels, receive not only light that is emitted from light-emitting area of display panels, but receive light that is generated because external environmental light enters display panels first and then is reflected back from display panels. As reflected light enters human eyes, human eyes sense a certain degree of brightness. However, because human eyes also receive light that is emitted from light-emitting area of display panels at the same time, human eyes would sense that brightness of OLED display panels is lowered. Therefore, researchers and manufacturers are now endeavored to reduce reflection of external environmental light.

According to existing technique, to reduce light reflection, polarizer is disposed on outer surface of display panels. As such, when external environmental light enters polarizer, only polarized light that has same polarization direction as that of polarizer can pass through polarizer. After polarized light is reflected back by metal electrodes, polarization direction of polarized light is changed, and thus polarized light cannot be reflected back to pass through polarizer anymore. Although such technique indeed reduces light reflection, disposing polarizer on outer surface of display panels also causes problem that a lot of light emitted from light-emitting area of display panels cannot pass through polarizer, resulting in extremely low light-transparency of display panels (for example, light-transparency of display panels is about 45%). Therefore, according to prior art, brightness has to be further increased to compensate for loss thereby. This unfavorably shortens lifetime of display panels. In addition, use of polarizer leads to increased manufacturing cost of display panels.

SUMMARY OF DISCLOSURE

The present disclosure provides a display panel where contrast thereof is increased.

To achieve the above-said objective, the present disclosure provides a display panel having an array substrate and a display layer thereon, wherein the display layer comprises a plurality of display units, each of the display units comprises:

a first electrode disposed on the array substrate;

an organic material functional layer including a light-emitting area and a light-transparent area connected to and surrounding the light-emitting area, wherein the light-emitting area is disposed on the first electrode;

a second electrode disposed on the organic material functional layer;

a pixel defining layer disposed under a bottom surface of the organic material functional layer and extending from the light-emitting area to the light-transparent area, wherein there is a light-transparent void between the pixel defining layer and the array substrate; and a color resist filling the light-transparent void.

In one preferred embodiment of the present disclosure, a metal wiring that is light-reflective is included in the array substrate.

In one preferred embodiment of the present disclosure, each of the display units is a blue light display unit, a green light display unit, or a red light display unit.

In one preferred embodiment of the present disclosure, a color of the color resist is same as a color emitted from the display unit to which the color resist corresponds.

In one preferred embodiment of the present disclosure, in a display area of the display panel, the blue light display unit, the green light display unit, and the red light display unit are arranged to be spaced apart in order.

In one preferred embodiment of the present disclosure, any two adjacent display units includes two adjacent color resists, and the two adjacent color resists have an overlapping region therebetween.

In one preferred embodiment of the present disclosure, the two adjacent color resists are a first color resist and a second color resist, the first color resist includes a first slope facing upward at a surface where the first color resist overlaps the second color resist, the second color resist includes a second slope facing downward at a surface where the second color resist overlaps the first color resist, and the second slope of the second color resist attaches to the first slope of the first color resist.

In one preferred embodiment of the present disclosure, the first electrode is an anode electrode, and the second electrode is a cathode electrode.

In one preferred embodiment of the present disclosure, the organic material functional layer comprises:

a hole transport layer, wherein a portion of the hole transport layer that corresponds to the light-emitting area is disposed on the first electrode;

a light-emitting layer disposed on the hole transport layer to correspond to the light-emitting area; and an electron transport layer disposed between the light-emitting layer and the second electrode.

In one preferred embodiment of the present disclosure, the organic material functional layer further comprises:

an electron injection layer disposed between the second electrode and the electron transport layer; and a hole injection layer disposed between the first electrode and the hole transport layer.

With corresponding color resists disposed in the region where the pixel defining layer is located, light reflected by metal electrodes included in the display panels and then further emitting outwardly is reduced, thus increasing contrast of display panels.

DETAILED DESCRIPTION

Figure 1:
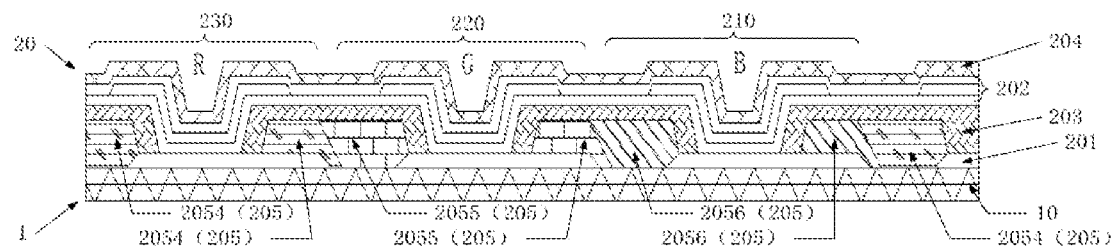
FIG. 1 shows a cross-sectional view of a structure of a display panel according to one preferred embodiment of the present disclosure.

The following embodiments refer to the accompanying drawings for exemplifying specific implementable embodiments of the present disclosure. Apparently, the illustrated embodiments are just a part of those of the present disclosure. Based on embodiments of the present disclosure, it is easy for any person having ordinary skill in the art to obtain other drawings without labor for inventiveness.

In addition, the terms "first" and "second" are used for distinguishing similar objects and should not be interpreted to refer to a certain order. It is understood that the objects for which these terms are used could be exchanged with each other under any appropriate conditions. Further, the term "comprising" and any variations thereof are intended to cover non-exclusive inclusion.

In the present disclosure, drawings and embodiments that are mentioned in the flowing description to explain principles of the subject invention are used for description and should not be interpreted to limit scope of the subject invention. Any person having ordinary skill in the art understands that principles of the subjection invention can be realized in any appropriately designed systems. Preferred embodiments will be provided in detail, which are shown in the drawings. In addition, please refer to drawings to facilitate understanding of these embodiments. In the drawings, the same reference symbol represents the same or similar components.

The terms used in the specification are merely used for purpose of description of certain embodiments, but are not intended to represent concept of the subject invention. Unless being indicated otherwise, expression with singular form covers expression with plural form. It is understood that, in the present disclosure, the terms such as "comprising", "having", "containing" includes meaning of any characteristics, numbers, steps, acts, or combinations thereof disclosed in the present disclosure, and do not exclude any additional one or more characteristics, numbers, steps, acts, or combinations thereof. In the drawings, the same reference symbol represents the same or similar components.

To clearly understand the subject invention, the following description involves preferred embodiments, structures, characters, and functional effects of the subjection invention, and is provided in correspondence with drawings.

As shown in FIG. 1, in one preferred embodiment of the present disclosure, the present disclosure provides a display panel having an array substrate 1 and a display layer thereon. The array substrate 1 includes a metal wiring that is light-reflective. In addition, the array substrate 1 includes some layers having insulation properties, including a gate insulation layer and a passivation layer. The gate insulation layer is a layer that is configured to insulate a gate line, a gate electrode, and a common electrode line from an active layer, a data line, a source electrode, a drain electrode. The passivation layer is a layer that is configured to insulate the data line and the source electrode from a pixel electrode. The pixel electrode is insulated from the common electrode. Moreover, the pixel electrode and the common electrode are disposed on different planes. The subject invention of the present disclosure is characterized in the display layer, and does not provide any modifications for the array substrate, therefore detailed description of the array substrate is omitted.

As shown in FIG. 1, the display layer includes a plurality of display units 20. Each of the display units 20 includes a first electrode 201, an organic material functional layer 202, a pixel defining layer 203, a second electrode 204, and a color resist 205. In the present embodiment, the first electrode 201 is an anode electrode that is disposed on the array substrate 1. The organic material functional layer 202 includes a light-emitting area 206 and a light-transparent area 207 connected to and surrounding the light-emitting area 206 (see FIG. 4), wherein the light-emitting area 206 is disposed on the first electrode 201. The second electrode 204 is disposed on the organic material functional layer 202. The pixel defining layer 203 is disposed under a bottom surface of the organic material functional layer 202 and extends from the light-emitting area 206 to the light-transparent area 207. There is a light-transparent void between the pixel defining layer 203 and the array substrate 1. The color resist 205 fills the light-transparent void.

Figure 2:
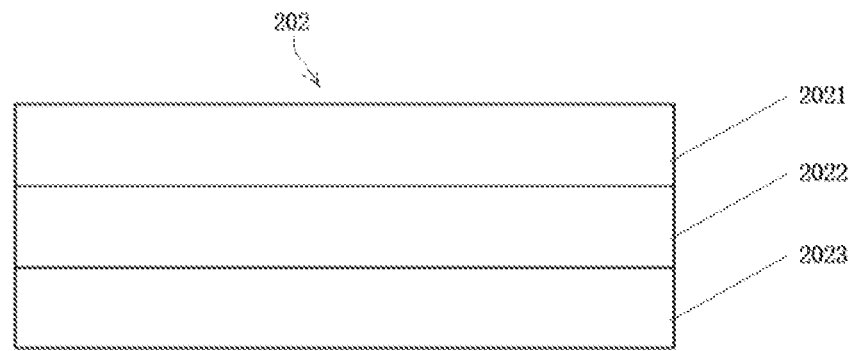
FIG. 2 shows a layered structure of an organic material functional layer according to one preferred embodiment of the present disclosure.

As shown in FIG. 2, the organic material functional layer 202 includes a hole transport layer 2021, a light-emitting layer 2022, and an electron transport layer 2023. A portion of the hole transport layer 2021 that corresponds to the light-emitting area 206 is disposed on the first electrode 201. The light-emitting layer 2022 is disposed on the hole transport layer 2021 to correspond to the light-emitting area 206. The electron transport layer 2023 is disposed between the light-emitting layer 2022 and the second electrode 204.

Figure 3:
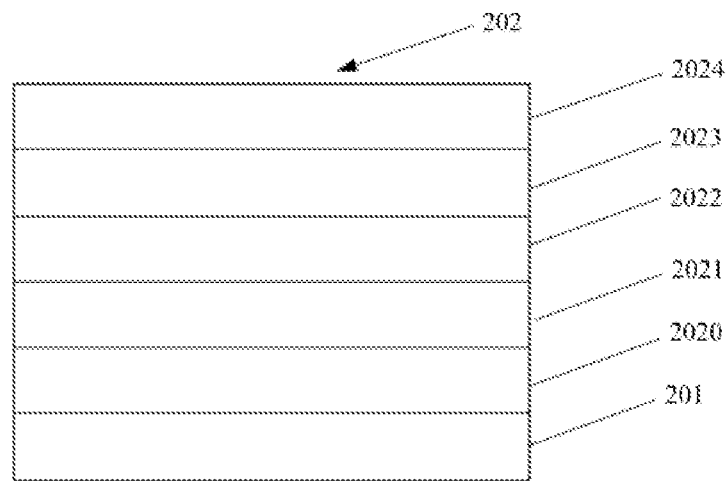
FIG. 3 shows a layered structure of a display layer according to one preferred embodiment of the present disclosure.

As shown in FIG. 3, in the present embodiment, to increase light-emitting efficiency of the organic material functional layer 202, the organic material functional layer 202 further includes an electron injection layer 2024 and a hole injection layer 2020. The electron injection layer 2024 is disposed between the second electrode 204 and the electron transport layer 2023. The hole injection layer 2020 is disposed between the first electrode 201 and the hole transport layer 2021.

Generally, based on light-emitting requirement of the display panel, the light-emitting layer 2022 includes a red light-emitting film, a blue light-emitting film, and a green light-emitting film. Thus, based on different colors of emitted light, each of the display units 20 is a blue light display unit 210, a green light display unit 220, or a red light display unit 230. It is desired that light passing through the light-transparent area 207 have the same color as that of light emitted from the light-emitting area 206 where the light-transparent area 207 corresponds, so that the light-transparent area 207 provides displayed images that have high brightness and do not have color shift, and the reflecting region where the light-transparent area 207 corresponds can serve as a mirror to effectively reflect environmental light or remarkably reduce reflection of environmental light. Therefore, a color of the color resist 205 is the same as a color emitted from the display unit 20 to which the color resist 205 corresponds. Based on light-emitting requirement of the display panel, in a display area of the display panel, the blue light display unit 210, the green light display unit 220, and the red light display unit 230 are arranged to be spaced apart in order. Thus, the color resist 202 could be a red color resist 2054, a green color resist 2055, or a blue color resist 2056, which corresponds to the display unit 20.

Figure 4:
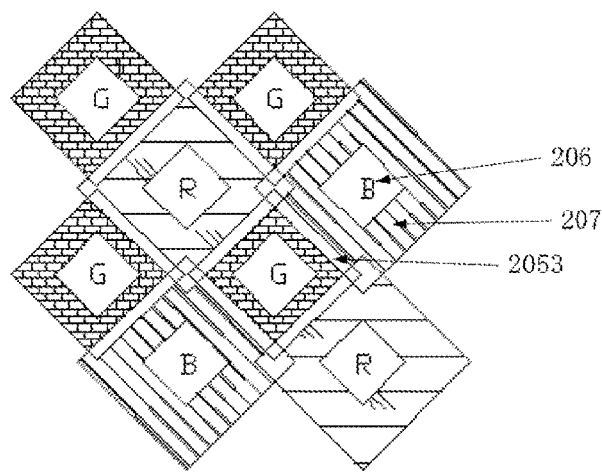
FIG. 4 shows a plan view of display units in display layer according to one preferred embodiment of the present disclosure.
Figure 5:
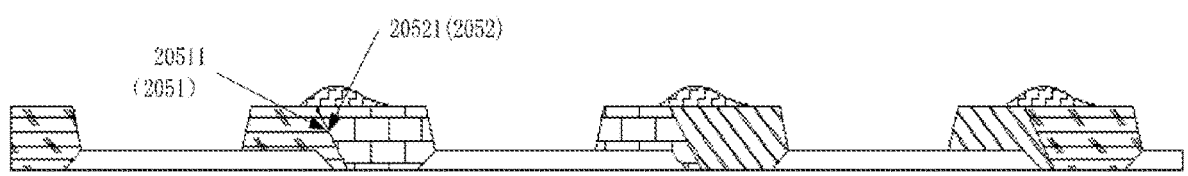
FIG. 5 shows a cross-sectional view of color resists according to one preferred embodiment of the present disclosure, depicting arrangement of different color resists.

As shown in FIGS. 4 and 5, to reduce light reflected by metal electrodes included in the display panels and then further emitting outwardly, and thus increase contrast of the display panel, any two adjacent display units includes two adjacent color resists, and the two adjacent color resists have an overlapping region 2053 therebetween. For example, assuming that the two adjacent color resists 205 are a first color resist 2051 and a second color resist 2052, the first color resist 2051 includes a first slope 20511 facing upward at a surface where the first color resist 2051 overlaps the second color resist 2052, the second color resist 2052 includes a second slope 20521 facing downward at a surface where the second color resist 2052 overlaps the first color resist 2051, and the second slope 20521 of the second color resist 2052 attaches to the first slope 20511 of the first color resist 2051. Although it is inevitable that a gap exists at interface between two color resists 205, the stacked structure of the slopes effectively avoids generation of such gap, thus increasing contrast of the display panel.

As stated above, the blue light display unit 210, the green light display unit 220, and the red light display unit 230 are arranged to be spaced apart in order, and two adjacent color resists 205 have an overlapping region 2053 therebetween. Detailed description therefor is provided below. For example, the first color resist is a red color resist, and the second color resist is a green color resist. Or, the first color resist is a green color resist, and the second color resist is a blue color resist. Or, the first color resist is a blue color resist, and the second color resist is a red color resist. With corresponding color resists 205 disposed in the region where the pixel defining layer 203 is located, contrast of the display panel is increased.

Regarding use of terms "a" and "said" and other similar terms during description of the subject invention (in particular, in the claims), these terms have to be interpreted to cover singular form and plural form. In addition, unless being indicated otherwise, numerical ranges stated in the present disclosure refer to a specific value interpreted to be broadened to have a relevant numerical range. Moreover, unless being indicated or to the contrary, any steps described in the present disclosure could be performed in any appropriate order. The subjection invention is not limited to the described order of steps. Any illustrative expressions (such as "for example") used in the present disclosure are merely used for description of the subject invention, and should not limit scope of the subject invention. Anyone having ordinary skill in the art can make a variety of modifications and variations without departing from the spirit and scope of the present disclosure as defined by the following claims.

While the present disclosure has been described with the aforementioned preferred embodiments, it is preferable that the above embodiments should not be construed as limiting of the present disclosure. Anyone having ordinary skill in the art can make a variety of modifications and variations without departing from the spirit and scope of the present disclosure as defined by the following claims.

What is claimed is:

1. A display panel, comprising an array substrate and a display layer disposed on the array substrate, wherein the display layer comprises a plurality of display units, and each of the display units comprises:
   a first electrode disposed on the array substrate;
   an organic material functional layer comprising a light-emitting area and a light-transparent area connected to and surrounding the light-emitting area, wherein the light-emitting area is disposed on the first electrode;
   a second electrode disposed on the organic material functional layer;
   a pixel defining layer disposed under a bottom surface of the organic material functional layer and extending from the light-emitting area to the light-transparent area, wherein there is a light-transparent void between the pixel defining layer and the array substrate; and
   a color resist filling the light-transparent void;
   wherein two adjacent color resists of any two adjacent display units have an overlapping region therebetween.

2. The display panel according to claim 1, further comprising a metal wiring disposed in the array substrate, wherein the metal wiring is light-reflective.

3. The display panel according to claim 1, wherein the display units comprises a blue light display unit, a green light display unit, and a red light display unit.

4. The display panel according to claim 3, wherein a color of the color resist is same as a color emitted from the display unit corresponding to the color resist.

5. The display panel according to claim 3, wherein in a display area of the display panel, the blue light display unit, the green light display unit, and the red light display unit are arranged in sequence and spaced apart.

6. The display panel according to claim 1, wherein the two adjacent color resists are a first color resist and a second color resist, the first color resist comprises a first slope facing upward where the first color resist overlaps with the second color resist, the second color resist comprises a second slope facing downward where the second color resist overlaps with the first color resist, and the second slope of the second color resist is attached to the first slope of the first color resist.

7. The display panel according to claim 1, wherein the first electrode is an anode electrode, and the second electrode is a cathode electrode.

8. The display panel according to claim 7, wherein the organic material functional layer comprises:
   a hole transport layer, wherein a portion of the hole transport layer corresponding to the light-emitting area is disposed on the first electrode;
   a light-emitting layer disposed on the hole transport layer and corresponding to the light-emitting area; and
   an electron transport layer disposed between the light-emitting layer and the second electrode.

9. The display panel according to claim 8, wherein the organic material functional layer further comprises:
   an electron injection layer disposed between the second electrode and the electron transport layer; and a hole injection layer disposed between the first electrode and the hole transport layer.

* * * * *